(12) United States Patent
Mathew et al.

(10) Patent No.: US 10,845,924 B2
(45) Date of Patent: Nov. 24, 2020

(54) CAPACITIVE DEVICES AND METHODS OF FABRICATING SAME

(71) Applicant: SUN CHEMICAL CORPORATION, Parsippany, NJ (US)

(72) Inventors: Mathew Mathew, Cedar Grove, NJ (US); Ramasamy Krishnan, North Brunswick, NJ (US)

(73) Assignee: SUN CHEMICAL CORPORATION, Parsippany, NJ (US)

( * ) Notice: Subject to any disclaimer, the term of this patent is extended or adjusted under 35 U.S.C. 154(b) by 72 days.

(21) Appl. No.: 15/768,256

(22) PCT Filed: Oct. 18, 2016

(86) PCT No.: PCT/US2016/057451
§ 371 (c)(1),
(2) Date: Apr. 13, 2018

(87) PCT Pub. No.: WO2017/070070
PCT Pub. Date: Apr. 27, 2017

(65) Prior Publication Data
US 2018/0314359 A1    Nov. 1, 2018

Related U.S. Application Data

(60) Provisional application No. 62/243,186, filed on Oct. 19, 2015.

(51) Int. Cl.
*G06F 3/045*    (2006.01)
*G06F 3/044*    (2006.01)
(Continued)

(52) U.S. Cl.
CPC .......... *G06F 3/044* (2013.01); *B41M 5/0023* (2013.01); *C09D 11/101* (2013.01); *C09D 11/52* (2013.01);
(Continued)

(58) Field of Classification Search
CPC .... B41M 5/0023; C09D 11/101; C09D 11/52; G06F 2203/04103; G06F 3/044;
(Continued)

(56) References Cited

U.S. PATENT DOCUMENTS

| | | |
|---|---|---|
| 5,997,044 A | 12/1999 | Behm et al. |
| 2013/0342226 A1* | 12/2013 | Wang ............... G06F 3/045 |
| | | 324/691 |

(Continued)

FOREIGN PATENT DOCUMENTS

| | | |
|---|---|---|
| CN | 203338329 | 12/2013 |
| WO | WO 2014/137147 A1 | 9/2014 |

(Continued)

OTHER PUBLICATIONS

International Preliminary Report issued in PCT/US2016/057451, dated Apr. 24, 2018.

(Continued)

*Primary Examiner* — Insa Sadio
(74) *Attorney, Agent, or Firm* — Marian E. Fundytus; Ostrolenk Faber LLP.

(57) ABSTRACT

Described herein are capacitive devices and methods for producing same using printing methods such as flexography, gravure, offset, lithography, etc. The capacitive devices are formed from printing conductive inks, non-conductive inks, masking ink layers, graphic artwork layers, and overprint layers on a substrate. Interaction between a conductive ink layer of the capacitive device with a touch screen device of a computer, tablet, smart phone, etc. causes a capacitive effect that allows information coded in capacitive device to be read, leading to an activity such as the download of content to the device having the touch screen.

27 Claims, 4 Drawing Sheets

(51) Int. Cl.
| | |
|---|---|
| *H05K 1/09* | (2006.01) |
| *H05K 3/12* | (2006.01) |
| *C09D 11/52* | (2014.01) |
| *H05K 1/16* | (2006.01) |
| *C09D 11/101* | (2014.01) |
| *B41M 5/00* | (2006.01) |
| *G06K 19/077* | (2006.01) |
| *H05K 1/02* | (2006.01) |
| *H05K 3/28* | (2006.01) |

(52) U.S. Cl.
CPC ..... G06K 19/07722 (2013.01); H05K 1/0266 (2013.01); H05K 1/092 (2013.01); H05K 1/162 (2013.01); H05K 3/1208 (2013.01); H05K 3/1275 (2013.01); *G06F 2203/04103* (2013.01); *H05K 3/1283* (2013.01); *H05K 3/285* (2013.01); *H05K 3/287* (2013.01); *H05K 2201/09936* (2013.01); *H05K 2201/10151* (2013.01); *H05K 2203/013* (2013.01); *H05K 2203/0126* (2013.01); *H05K 2203/1545* (2013.01); *H05K 2203/1572* (2013.01)

(58) Field of Classification Search
CPC ........... G06K 19/07722; H05K 1/0266; H05K 1/092; H05K 1/162; H05K 2201/09936; H05K 2201/10151; H05K 2203/0126; H05K 2203/013; H05K 2203/1545; H05K 2203/1572; H05K 3/1208; H05K 3/1275; H05K 3/1283; H05K 3/285; H05K 3/287
See application file for complete search history.

(56) References Cited

U.S. PATENT DOCUMENTS

| | | | |
|---|---|---|---|
| 2014/0033331 A1* | 1/2014 | Salle | ........................ G06F 21/87 726/34 |
| 2014/0295063 A1 | 10/2014 | Petcavich et al. | |
| 2015/0212872 A1* | 7/2015 | Modzelewski | .. G01N 33/48771 422/68.1 |

FOREIGN PATENT DOCUMENTS

| | | |
|---|---|---|
| WO | WO 2014/185956 A1 | 11/2014 |
| WO | WO 2015/023428 A2 | 2/2015 |
| WO | WO 2015/105514 A1 | 7/2015 |

OTHER PUBLICATIONS

International Search Report issued in International Application No. PCT/US16/057451, dated Jan. 17, 2017.
Written Opinion of the International Searching Authority issued in International Application No. PCT/US16/057451, dated Jan. 17, 2017.
Extended European Search Report issued in couterpart European Application No. 16858050.4, dated Sep. 17, 2019.

* cited by examiner

CAPACITIVE DEVICES AND METHODS OF FABRICATING SAME

The present application is a § 371 National Phase application based on PCT/US2016/057451 filed Oct. 18, 2016, which claims the benefit of U.S. Provisional Application No. 62/243,186, filed Oct. 19, 2015 the subject matter of each of which is incorporated by reference in their entirety.

FIELD OF THE INVENTION

The subject matter of the disclosure relates to articles of manufacture that, by capacitive interaction, induce a response from a touch screen device, e.g., a device provided with a touch screen, touch pad or similar component, and is further directed to methods for producing such articles. Such articles are produced from printing inks applied to a substrate by one or more printing methods.

BACKGROUND OF THE INVENTION

The rise of information technology has been accompanied by a rapid development in the sector of personal computers, laptops, smart phones, tablet computers, personal desktop assistants (PDAs) and other devices. Touch screens and touch pads may be components of these devices. Through a touch screen to a touch pad, a user can induce an input to the device and/or a response from the device by touching a designated area of screen or pad, or by moving a finger or stylus over the screen or pad.

The information technology industry continuously develops new ways to deliver information to a user. For example, a device such as a laptop, a tablet computer, a smart phone, etc., may have components such as a camera that is coupled to the device processor unit. The device's user may come across an advertisement for a product or service in a magazine. The advertisement may include a coded section, such as a barcode or other kind of code that is visible to the user. The advertisement may invite the user to scan the code with their device. In return, content is delivered to the device for the user to consume. The content, e.g., information, may be any number of different things, such as a coupon, an entry into a contest offering a prize, or the delivery of an item. The content may unlock access to a thing, such as the download of a music track or video.

The scanning of the bar code or other visible code can be implemented through the device camera. An app, e.g., an application embodying software code, runs on the device's processor, interprets the scan, and instructs and/or calls for the delivery of the content, information, promotional material, etc. to the user's device.

US 20120306813 describes a system and method for retrieving information from an information carrier by means of a capacitive touch screen. The system includes one or more information carriers having dielectric and/or conductive patterns and a detection device having a capacitive touch screen. In the method, an interaction is induced between the information carrier and the touch screen based on a difference in the dielectric coefficient and/or the conductivity of the pattern, which generates a touch signal. The interaction is induced by relative motion between the information carrier and the touch screen. In the system, the detection device is able to decode the information upon interaction between the information carrier and the touch screen, wherein the interaction is caused by a difference in the dielectric coefficient and/or the conductivity of the pattern.

The conductive regions of the information carriers described above are made by cold foil stamping a conductive material onto the device structure. Disadvantageously, cold foil stamping is a slow and relatively inefficient process that can be practiced at speeds of only about 200 feet per minute (fpm).

SUMMARY OF THE INVENTION

Described herein are printed capacitive devices that are flexible, durable, and rapidly producible at relatively low cost. Also described herein are methods of manufacturing printed capacitive devices. The capacitive devices are fabricated from printing inks that are applied to a substrate by printing in accordance with methods such as flexography, lithography, offset, screen printing, gravure, etc.

In one embodiment, a capacitive device is described that includes a substrate, an electrically conductive ink layer and a non-electrically conductive ink layer printed on the substrate in a selected sequence, and one or more masking layers printed over the electrically conductive ink layer and the non-electrically conductive ink layer.

In a further embodiment, the capacitive device includes graphic artwork printed over the one or more masking layers. In a still further embodiment, a final overprint may be applied over the graphic artwork to protect the structure of the device.

In one embodiment, the layers are cured, e.g., the electrically conductive ink layer, the non-electrically conductive ink layer, the masking layers, the graphic artwork layers, and the overprint layers are cured in a manner appropriate for the independent ink compositions of the layers.

In one embodiment, the selected sequence is printing the electrically conductive ink layer on the substrate, followed by printing the non-electrically conductive ink layer on the electrically conductive ink layer. In another embodiment, the selected sequence is printing the non-electrically conductive ink layer on the substrate, followed by printing the electrically conductive ink layer on the non-electrically conductive ink layer.

In one embodiment, the electrically conductive ink layer is printed in a pattern.

In another embodiment, described is a capacitive device having a substrate on which layers are printed on two sides. An electrically conductive ink layer and a non-electrically conductive ink layer are printed on a substrate side in a selected sequence. One or layers are printed on another substrate side, the layers being chosen from one or more non-electrically conductive ink layers, one or more masking layers, one or more graphic artwork layers, and one or more overprint layers.

In a more particular arrangement, the one or more layers printed on the other substrate side include one or more non-electrically conductive ink layers, one or more graphic artwork layers, and one or more overprint layers. In a more particular arrangement, a non-electrically conductive ink layer, graphic artwork layers, and an overprint layer are printed on the substrate side that is opposite to the substrate side on which the electrically conductive ink layer and a non-electrically conductive ink layer are printed thereon in a selected sequence.

In yet another embodiment, described is a method of preparing a capacitive device, which includes printing an electrically conductive ink layer and a non-electrically conductive ink layer on a substrate in a selected sequence, printing one or more masking layers to cover the electrically conductive ink layer and/or the non-electrically conductive ink layer. Graphic artwork in the form of one or more of a design, logo, text, etc. is printed over the one or more masking layers. One or more layers of a final overprint such as an overprint varnish is printed over the graphic artwork. One or more of the layers described above may be subject to a curing step.

By printing the electrically conductive ink of the capacitive device in a pattern, electrically conductive and electrically non-conductive regions are provided that can generate a capacitive interaction effect that occurs when the device is read by another device, e.g., a touch screen or touch pad. The effect is induced when the capacitive device is brought in contact with, in sufficiently close proximity to, and/or moves in relation to a touch screen or a touch pad. The interaction may be induced by relative motion between the information carrier and the touch screen.

The capacitive devices of the present disclosure store coded information in the electrically conductive layer. The coded information may correspond and/or correlate to the selected pattern in which the electrically conductive layer is printed. The coded information included in the capacitive device, e.g., present in the patterned electrically conductive layer, can be hidden from an observer's view by printing masking layers over the electrically conductive ink layer (and electrically non-conductive layer). The coded information may be read from the capacitive device by a touch screen device or touch pad through capacitive interaction. Capacitive interaction may be induced by the movement of the capacitive device relative to the touch screen or touch pad, or vice versa. Decoding of the information may take place in the processor unit of a device associated with the touch screen, such as for example, in the processor of a smart phone having the touch screen. A software program running on the processor can be used to decode the information. This would be an example of a local-type decoding. In another embodiment, decoding may occur in a remote location, such as in a server environment, or in a cloud computing environment, with a signal being transmitted from the device to a server or a cloud computing environment, where the information is decoded and with content being transmitted back to the device. Thus, the capacitive device may locally induce events in a device, and in another arrangement, the capacitive device may induce events in an external system such as a data network located in a server or a cloud computing environment.

Hiding the coded information from view, e.g., hiding it from being visually observable may be advantageous because it makes the information more difficult to copy. The coded information, for example, may be constructed from an arrangement of electrically conductive and electrically non-conductive regions, applied in a pattern for example, which is rendered non-visible to the user, since the code would be obscured or hidden by masking layers. In hiding the code, it is possible to prevent a user from knowing where the code is located on the substrate of the capacitive device. Covering the electrically conductive ink layer with a high-opacity masking ink, e.g., an ink with opacity sufficient to substantially remove the electrically conductive ink layer from view, would hide the electrically conductive ink layer from view.

Capacitive devices made in accordance with the described principles can be rapidly manufactured. For example, a capacitive device can be manufactured in which all printing layers, or most of the layers, are applied using high speed flexographic printing. Flexographic printing occurs at speeds of greater than 1000 fpm, and possibly at printing speeds exceeding 1500 fpm. Further, manufacturing a capacitive device by printing it is a more cost effective method when compared to making it by cold stamping.

One or more masking layers are printed over the electrically conductive layer. When more than one masking layer is applied, the layers may be printed of the same ink or at least two layers may be printed of different inks. The masking layers, whether they be of the same or dissimilar inks, may be printed by printing methods such as, flexography, lithography, gravure, screen printing, offset, etc.

It is often advantageous to include graphic artwork in the capacitive device. For example, graphic artwork may provide the identity of the source of the coded information, it may invite a person to decode the information, and/or it may explain how to decode the information. Graphic artwork may include one or more of letters, numbers, words, text, instructions, information, symbols, logos, pictures, trademarks, trade names, designs, etc. Graphic artwork may be applied to the device by printing methods using suitable printing inks. After printing graphic artwork, the article can be finished with an overprint layer, to protect the printed article from damage, e.g., to provide abrasion- and scratch-resistance.

The capacitive devices described herein may be used in touch screens. Touch screens are used in devices such as smart phones, mobile phones, displays, tablet-PCs, tablet notebooks, graphic tablets, television devices, track pads, touch pads, input devices, PDAs, and/or MP3 devices. Technologies to perform this detection include resistive, capacitive, acoustic and optical technologies.

The capacitive devices described herein may be used in information carriers, such as, for example, printed products, business cards, credit cards, debit cards, stamps, signatures, postcards, tickets authorizing entry (stadiums, arenas, theaters, museums, etc.), tickets authorizing travel (trains, buses, subways, airplanes, etc.), admission cards to restricted areas (both physical areas and virtual zones), member cards, certificates (e.g., authenticating of an object and/or its origin), bill of delivery and/or sale, abstracts of accounts, instruction leaflets, vouchers (e.g. for objects in computer games and/or downloads of music, videos, e-books) and the like, but also any common products such as cups, glasses, consumer packaged goods, consumables and pre-products.

The principles embodied in the present disclosure are not limited to touch screens and/or information carriers. Other capacitive devices whose mode of detection is based on capacitive interaction may be produced as well. In particular, other touch devices such as touch pads or track pads may be used for the present invention. For example, information encoded on an information carrier may be transferred to a laptop by placing the information carrier on the touch pad or track pad of the laptop, which identifies the pattern via capacitive interaction. Accordingly, the detection device may comprise another touch device rather than a touch screen and the method may utilize another touch device rather than a touch screen, preferably a touch pad or track pad.

In accordance with the present capacitive device embodiments, produced from the inks described herein, which embodiments are produced by employing efficient printing methods, it is possible to create a capacitive device that induces an interaction between the device and a touch screen of a phone, laptop tablet computer, etc., based on the dielectric coefficient and/or conductivity of the pattern. The capacitive devices are manufactured quickly, efficiently, and at relatively low cost.

The capacitive devices embodying the present principles exhibit suitable abrasion resistance, exhibit good layer-to layer adhesion, exhibit good resistance to removal, scratch resistance, flexibility and exhibit other desirable performance properties.

In yet another embodiment, a capacitive device is prepared by printing an electrically conductive offset ink on a substrate, printing a background offset black ink over the electrically conductive ink, printing an aluminum-based offset ink over the background offset black ink, and then applying one more layers of offset white ink.

Requirements for abrasion resistance, adhesion flexibility and other key performance properties are achieved using the methods of the present application.

DETAILED DESCRIPTION

Figure 1A:
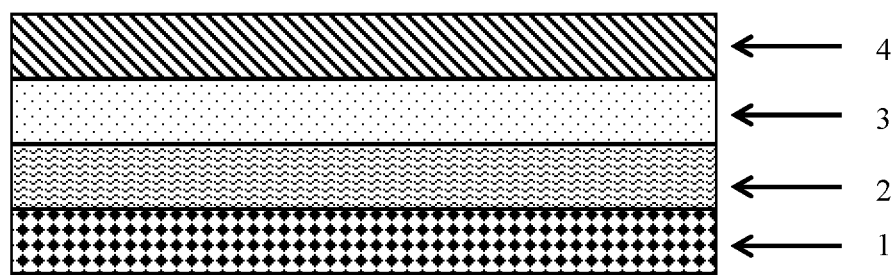
FIG. 1(A): Illustrates an embodiment of the sequence of printing of ink layers and a masking layer printed on the substrate, wherein an electrically conductive ink layer (2) is printed on a substrate (1), a non-electrically conductive ink layer (3) is printed on top of the electrically conductive ink layer (2), and a masking layer (4) is printed on top of the non-electrically conductive ink layer (3). The order of the layers from bottom to top is: substrate (1), electrically conductive ink layer (2), non-electrically conductive ink layer (3), and masking layer (4).
Figure 1B:
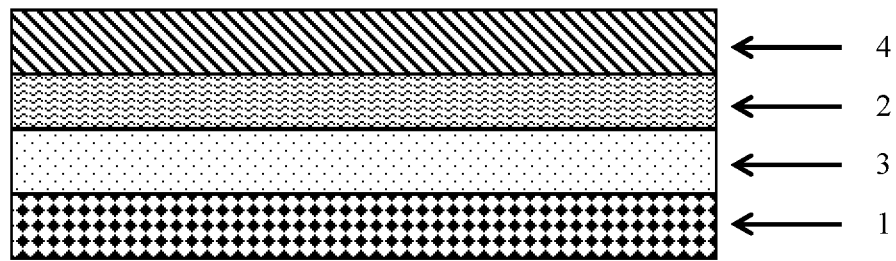
FIG. 1(B): Illustrates an embodiment of the sequence of printing of ink layers and a masking layer printed on the substrate, wherein a non-electrically conductive ink layer (3) is printed on a substrate (1), an electrically conductive ink layer (2) is printed on top of the non-electrically conductive ink layer (3), and a masking layer (4) is printed on top of the electrically conductive ink layer (2). The order of layers from bottom to top is: substrate (1), non-electrically conductive ink layer (3), electrically conductive ink layer (2), and masking layer (4).
Figure 2A:
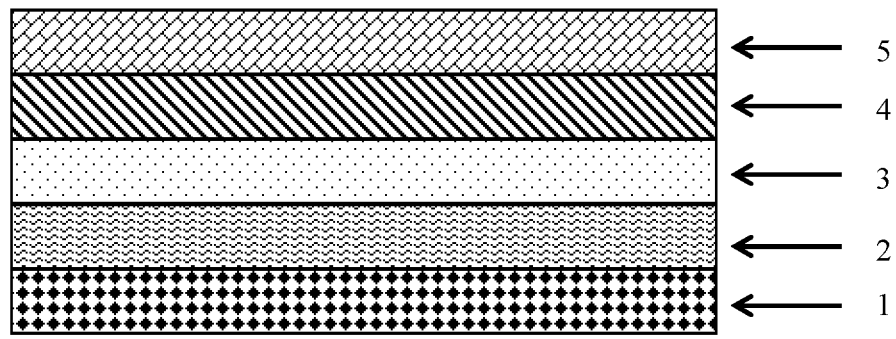
FIG. 2(A): Illustrates an embodiment of the sequence of printing of ink layers, a masking layer, and a printed graphic artwork layer printed on the substrate, wherein an electrically conductive ink layer (2) is printed on a substrate (1), a non-electrically conductive ink layer (3) is printed on top of the electrically conductive ink layer (2), a masking layer (4) is printed on top of the non-electrically conductive ink layer (3), and a printed graphic artwork layer (5) is printed on top of the masking layer (4). The order of the layers from bottom to top is: substrate (1), electrically conductive ink layer (2), non-electrically conductive ink layer (3), masking layer (4), and printed graphic artwork layer (5).
Figure 2B:
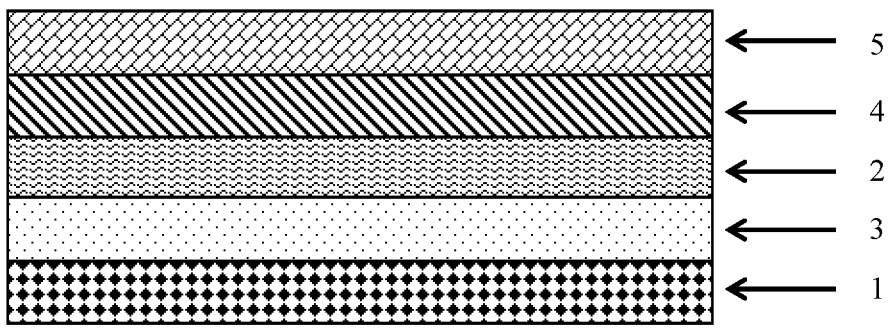
FIG. 2(B): Illustrates an embodiment of the sequence of printing of ink layers, a masking layer, and a printed graphic artwork layer printed on the substrate, wherein a non-electrically conductive ink layer (3) is printed on a substrate (1), an electrically conductive ink layer (2) is printed on top of the non-electrically conductive ink layer (3), a masking layer (4) is printed on top of the electrically conductive ink layer (2), and a printed graphic artwork layer (5) is printed on top of the masking layer (4). The order of layers from bottom to top is: substrate (1), non-electrically conductive ink layer (3), electrically conductive ink layer (2), masking layer (4), and printed graphic artwork layer (5).
Figure 3A:
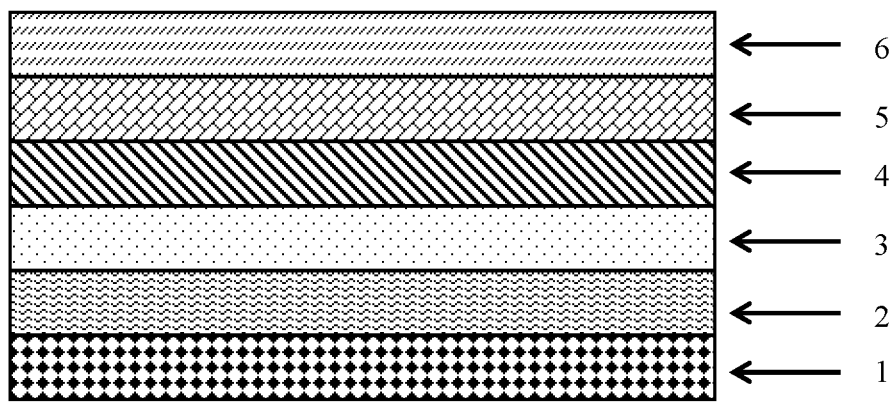
FIG. 3(A): Illustrates an embodiment of the sequence of printing of ink layers, a masking layer, a printed graphic artwork layer, and an overprint layer printed on the substrate, wherein an electrically conductive ink layer (2) is printed on a substrate (1), a non-electrically conductive ink layer (3) is printed on top of the electrically conductive ink layer (2), a masking layer (4) is printed on top of the non-electrically conductive ink layer (3), a printed graphic artwork layer (5) is printed on top of the masking layer (4), and an overprint layer (6) is printed on top of the graphic artwork layer (5). The order of the layers from bottom to top is: substrate (1), electrically conductive ink layer (2), non-electrically conductive ink layer (3), masking layer (4), printed graphic artwork layer (5), and overprint layer (6).
Figure 3B:
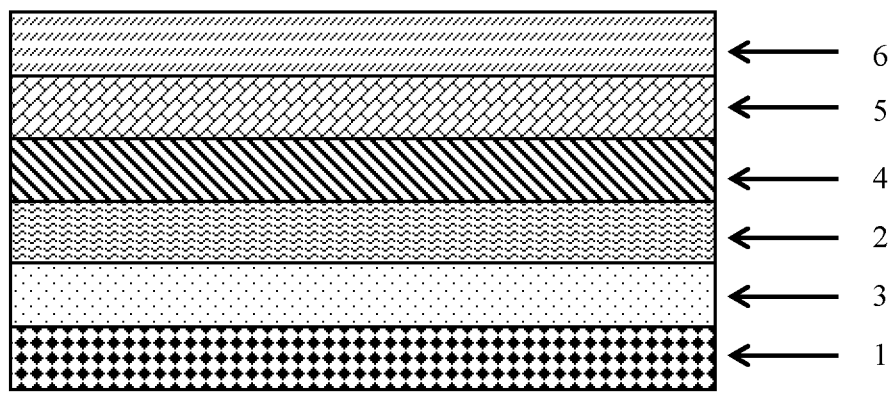
FIG. 3(B): Illustrates an embodiment of the sequence of printing of ink layers, a masking layer, a printed graphic artwork layer, and an overprint layer printed on the substrate, wherein a non-electrically conductive ink layer (3) is printed on a substrate (1), an electrically conductive ink layer (2) is printed on top of the non-electrically conductive ink layer (3), a masking layer (4) is printed on top of the electrically conductive ink layer (2), a printed graphic artwork layer (5) is printed on top of the masking layer (4), and an overprint layer (6) is printed on top of the printed graphic artwork layer (5). The order of layers from bottom to top is: substrate (1), non-electrically conductive ink layer (3), electrically conductive ink layer (2), masking layer (4), printed graphic artwork layer (5), and overprint layer (6).
Figure 4A:
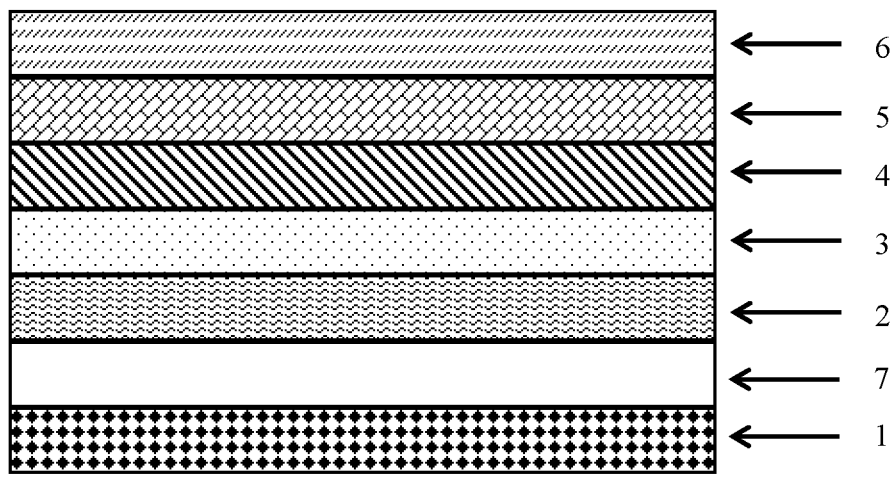
FIG. 4(A): Illustrates an embodiment of the sequence of printing of, a primer layer, ink layers, a masking layer, a printed graphic artwork layer, and an overprint layer printed on the substrate, wherein a primer layer (7) is printed on a substrate (1), an electrically conductive ink layer (2) is printed on top of the primer layer (7), a non-electrically conductive ink layer (3) is printed on top of the electrically conductive ink layer (2), a masking layer (4) is printed on top of the non-electrically conductive ink layer (3), a printed graphic artwork layer (5) is printed on top of the masking layer (4), and an overprint layer (6) is printed on top of the graphic artwork layer (5). The order of the layers from bottom to top is: substrate (1), primer layer (7), electrically conductive ink layer (2), non-electrically conductive ink layer (3), masking layer (4), printed graphic artwork layer (5), and overprint layer (6).
Figure 4B:
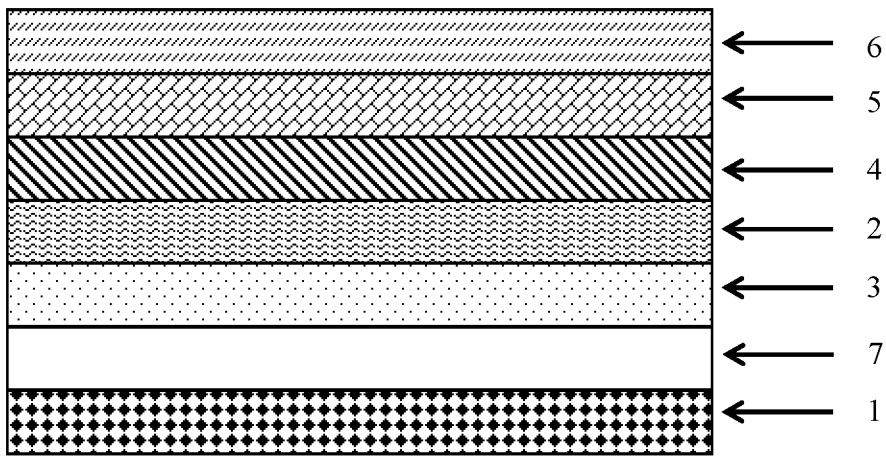
FIG. 4(B): Illustrates an embodiment of the sequence of printing of, a primer layer, ink layers, a masking layer, a printed graphic artwork layer, and an overprint layer printed on the substrate, wherein a primer layer (7) is printed on a substrate (1), a non-electrically conductive ink layer (3) is printed on top of the primer (7), an electrically conductive ink layer (2) is printed on top of the non-electrically conductive ink layer (3), a masking layer (4) is printed on top of the electrically conductive ink layer (2), a printed graphic artwork layer (5) is printed on top of the masking layer (4), and an overprint layer (6) is printed on top of the printed graphic artwork layer (5). The order of layers from bottom to top is: substrate (1), primer layer (7), non-electrically conductive ink layer (3), electrically conductive ink layer (2), masking layer (4), printed graphic artwork layer (5), and overprint layer (6).

It is to be understood that the foregoing general description and the following detailed description are exemplary and explanatory only, and are not restrictive of any subject matter claimed.

Unless otherwise defined, all technical and scientific terms used herein have the same meaning as is commonly understood by one of skill in the art to which the inventions belong. All patents, patent applications, published applications and publications, websites and other published materials referred to throughout the entire disclosure herein, unless noted otherwise, are incorporated by reference in their entirety for any purpose.

Definitions

In this application, the use of the singular includes the plural unless specifically stated otherwise. As used herein, the singular forms "a," "an" and "the" are intended to include the plural forms as well, unless the context clearly indicates otherwise.

In this application, the use of "or" means "and/or" unless stated otherwise

As used herein, the terms "comprises" and/or "comprising" specify the presence of the stated features, integers, steps, operations, elements, and/or components, but do not preclude the presence or addition of one or more other features, integers, steps, operations, elements, components, and/or groups thereof. Furthermore, to the extent that the terms "includes," "having," "has," "with," "composed," "comprised" or variants thereof are used in either the detailed description or the claims, such terms are intended to be inclusive in a manner similar to the term "comprising."

As used herein, ranges and amounts can be expressed as "about" a particular value or range. "About" is intended to also include the exact amount. Hence "about 5 percent" means "about 5 percent" and also "5 percent." "About" means within typical experimental error for the application or purpose intended.

As used herein, the terms "inks and coatings," "inks," "compositions" and "fluids" are used interchangeably.

The present disclosure describes capacitive and methods of making same. The capacitive devices exhibit good performance properties, such as abrasion resistance, scratch resistance, flexibility, etc. The methods of manufacture are believed to be responsible, in all or in part, for the advantages exhibited by the capacitive devices described herein. For example, the layers of the devices are printed in a fast, cost-efficient sequence that allows for rapid production of devices.

The capacitive devices of the present embodiments may be produced by traditional printing methods such as, for example, flexography, lithography, offset, screen printing, and gravure. Conventional printing machines and other equipment may be employed in making the capacitive devices.

Substrate

The substrate of the information carrier may be rigid or flexible. Preferably, the substrate comprises one or more of materials such as plastics, flexible films, synthetic materials, paper, carton, products derived from timber, composite materials, ceramics, glass, cloths, textiles, leather or any combination of the mentioned materials. Preferred synthetic materials comprise flexible films, such as polyvinyl chloride (PVC), glycol-modified polyethylene terephthalate (PETG), polycarbonate (PC), PETix™ PETF—a crystalline biaxially-oriented polyester film, polyethylene (PE), polypropylene (PP), and synthetic paper.

Electrically Conductive Ink

The electrically conductive ink may be printed directly on the substrate, or it may be printed after the non-electrically conductive ink is printed on the substrate. The Applicants have discovered that it is advantageous to employ an electrically conductive ink that, when applied, e.g., printed, provides a surface resistivity that is less than 200 kilo ohm/square. More preferably, surface resistivity after the printing of the electrically conductive ink is less than 150 kilo ohm/square, even more preferably, less than 100 kilo ohm/square, still more preferably, less than 50 kilo ohm/square, even still more preferably, less than 25 kilo ohm/square, and still even more preferably, less than 15 kilo ohm/square. An electrically conductive ink that satisfies this property has been found to improve the performance of the resulting capacitive device.

The conductive ink can be a water-based conductive ink or a solvent-based conductive ink. An electrically conductive material, for example carbon black, graphite, silver, singularly or in combinations thereof, can be added to the ink formulation to give the ink its electrically conductive property. Preferably, the conductive material is in particle form. The addition of carbon black or graphite produces an electrically conductive black colored ink. The addition of particles of silver gives the electrically conductive ink a silver color. The electrically conductive ink may have a different color that is attained by including pigments and/or dyes in the electrically conductive ink formulation.

In one embodiment, the conductive ink may be a water-based conductive ink that includes a suitable water-based resin, for example, JONCRYL® 690, an acrylic resin available from BASF. The water-based conductive ink may be a flexo ink, e.g., an ink suited for flexographic printing that includes a conductive material. In another embodiment, the electrically conductive ink may be a solvent-based ink that includes a suitable solvent-based resin such as polyvinyl butyral. The solvent-based conductive ink may be a flexo ink, e.g., an ink suited for flexographic printing. The electrically conductive inks may also be printed by the gravure, screen printing, lithographic, flexographic, and offset methods, among others.

The electrically conductive water-based ink may have a composition including about 10 wt % to about 99 wt % of a pigment/resin/conductive particle dispersion, an alkylene glycol, deionized water, and an amine, such as a mono-, di- or tri-alkanol amine, e.g., triethanol amine. The dispersion may be one of the FLEXIVERSE® dispersions available from Sun Chemical Corporation, such as LFDCB02: Flexiverse® Black, which includes one or more of carbon black and graphite as an electrically conductive material.

The electrically conductive water-based ink may also have a composition including about 10 to about 25 wt % conductive dispersion, (e.g., FLEXIVERSE®Black), about 40 to about 70 wt % water, and about 2 to about 5 wt % amine, such as a mono-, di- or tri-alkanol amine, e.g., triethanol amine.

The electrically conductive solvent-based ink has a composition that includes about 25 to about 40 wt % conductive dispersion, about 5 to about 25 wt % resin, and about 30 to about 65 wt % solvent.

The electrically conductive ink may be cured, e.g., by heating or by blowing forced air over the printed surface. While the electrically conductive ink layer may be applied in multiple layers, it has been found that single layer of electrically conductive ink is generally sufficient.

The electrically conductive ink layer is preferably printed in a pattern which provides for electrically conductive regions embodied by the printed ink portions and non-electrically conductive regions, which are parts of the pattern where the electrically conductive ink is not printed. The electrically non-conductive portions may correspond to the regions where the electrically non-conductive ink is printed. The aspects of the pattern that is printed, e.g., the pattern shape, and the sizes and dimensions of the components of the pattern (e.g., lines, geometric shapes), may be selected in advance of printing. In one embodiment, the pattern includes geometric shapes that are connected together by lines that extend between the geometric shapes.

Electrically Non-Conductive Inks

One or more layers of electrically non-conductive ink, which are also known as "background ink", may be printed over the electrically conductive ink layer (or, as indicated, printed in a reverse sequence, with the non-electrically conductive ink being printed on the substrate and the electrically conductive ink being printed over the non-electrically conductive ink). The non-conductive ink may be an energy-curing non-conductive ink, e.g., a UV-curing ink or an actinically curing ink. After printing, the ink layer is cured by exposing it to UV radiation, or in the appropriate case, to another form of actinic radiation. The ink composition may include energy excitable initiators that create reactive species when exposed to radiation, such as UV-energy and visible light energy. The non-electrically conductive ink may be a colored ink, as indicated below. The non-conductive ink may be a hybrid ink that includes energy-curing components, such as a UV-curing non-conductive ink, and an inert ink component that mixes with the UV-curing ink but which is not part of the cross linked polymer backbone of the UV-curing ink. The inert portions of the hybrid inks may include solvents such as glycol ether, and are cured by exposure to heat and/or forced air. In this arrangement, UV-curing and heat/forced air curing may occur to provide for hardening and drying of the ink. An oxidatively-curing ink, such as an alkyd resin based ink, may be included in the hybrid ink composition.

The electrically non-conductive ink may also be chosen from a water-based electrically non-conductive ink or a solvent-based ink electrically non-conductive ink. These inks may be cured by exposure to heat and/or forced air.

The electrically non-conductive ink layer may be printed by printing methods such as offset printing, flexographic printing, lithographic printing, screen printing, and gravure printing. While black may be the preferred color for the electrically non-conductive ink, other colors may be employed. A colored ink can be prepared by adding dyes or pigments singly or in combination to achieve the desired color. If multiple layers of the non-conductive are printed, then any combination of non-conductive inks may be used (e.g. UV, hybrid, water-based, solvent-based) and could be applied by a combination of one or more print methods (e.g. lithography, screen printing, flexography, gravure, offset, etc.).

In accordance with the principles embodied in the described embodiments, the conductive and non-conductive layers can be printed on the substrate in either order. For example the non-conductive ink layer can be applied first, on the substrate (e.g., directly on the substrate). The conductive ink layer can then be applied over the non-conductive ink layer, e.g., applied directly over the non-conductive ink layer. This order can be reversed, e.g., the conductive ink layer can be applied first on the substrate (e.g., directly on the substrate). The non-conductive ink can be applied over the conductive ink layer, e.g., applied directly over the conductive ink. The sequence may be selected in advance of starting the manufacture of the capacitive device.

A suitable UV-curable ink may include an acrylic polymer resin, colorants, carbon black, dispersants, one or more monomers, a photoinitiator, and other additives. Suitable UV-curable inks include FLM 46® Black, available from Sun Chemical Corporation, Parsippany, N.J.

A suitable actinically-curable non-conductive ink may include an acrylate resin, oligomer, monomer, wax (e.g., a polyethylene wax) carbon black, an initiator, such as one activated by visible light, and other additives. Suitable UV-curable inks include SUNCARTE® Black, available from Sun Chemical Corporation, Parsippany, N.J.

A suitable water-based non-electrically conductive ink includes a water-based black pigment dispersion, an AQUA-SUN GW® Vehicle (an aqueous acrylic resin solution available from Sun Chemical Corporation that includes water, acrylic resin, alkanolamine and other additives), deionized water and propylene glycol. A suitable commercial product is the R3870-88-B® water based non-conductive black ink, available from Sun Chemical Corporation.

A suitable solvent-based non-electrically conductive ink includes a solvent-based pigment dispersion, such as a black pigment dispersion, a resin such as a polyurethane resin, a wax, and a nitrocellulose extender. A suitable commercial product is Wrigley's non-conductive black R3870-83-A, available from Sun Chemical Corporation.

Primer

It may be advantageous to apply a primer layer to the substrate before printing the electrically conductive layer and the non-electrically conductive layer. Applying a primer can result in a better printed image and improve the adhesion of the printing ink to the substrate.

The primer composition may include a resin, a solvent and additives. Suitable commercially available primers include TERRAWET®, from Actega, and the VAPOR-COAT® and HYDRABAN® water-based coatings from Michelman. The primer may be applied by flexography, lithography, gravure, screen printing, and offset printing.

Masking Layer(s)

Over the applied sequence of conductive and non-conductive ink, one or more layers are printed to mask and protect the underlying conductive layer. The one or more masking layers may comprise a masking white ink layer. The masking ink may be a color other than white.

For the masking ink layer, a water-based ink, a solvent-based ink, an actinically-curing ink, a UV-curing ink and a hybrid ink can be used. It is preferred that the ink used as a masking layer ink have a high opacity. The masking layer can be printed flexographically, by lithography, by offset, and by gravure.

The skilled person may select the number of masking layers to be applied. Generally, the number of layers should be sufficient to cover the underlying conductive layer. The number of layers may be selected based on the environment in which the information carrier will be displayed and used. Factors to consider include but are not limited to the amount of stress the carrier may be subjected to, whether carrier is to be flexed or bent (e.g., as would be the case if the carrier was a label on a soft drink bottle).

The inks used in the masking layers may be of the same or different compositions. For example, while the initial masking layers may be a masking white ink, the further masking layers may be an opaque white ink, and/or a non-conductive silver ink. Other colors and ink types may be employed as the further masking layers, e.g., a water-based ink, a solvent-based ink, a UV curing ink, and/or a hybrid ink.

A masking layer suitable for use in making the described capacitive devices may include a material such as titania ($TiO_2$) and/or clay, which provides the opacity that is useful in providing the covering and/or hiding property of a masking layer. A suitable water-based masking layer may include an acrylic resin, a glycol, titania and/or clay, wax, an alkanol amine, water, and other additives.

A suitable solvent-based masking ink may include a varnish, such as a cellulose-based varnish, a urethane resin, an alkyl acetate, titania and/or clay, an alkanol and other additives.

A suitable actinically-curing masking ink may include an one or more acrylate monomers, titania and/or clay, a diluent, such as a pyrrolidone diluent, an initiator, and other additives.

A suitable UV-curing masking ink may include one or more acrylate monomers, a photoinitiator, titania and/or clay, a diluent, such as a pyrrolidone diluent, and other additives.

Ink and coating compositions suitable for use as a masking layer include, for example, PLATINUM® 100, and PMF® 10068K, available from Sun Chemical Corporation.

A suitable hybrid masking ink may include a UV-curable masking ink composition and an AP resin solution, e.g., a ketone-aldehyde condensation resin.

Any commercially available non conducting inks that contain titania and/or clay may be used as a masking agent. It is preferred that the masking ink be a high opacity ink, e.g., one sufficient to cover and hide the underlying electrically conductive ink layer.

Graphic Artwork

The next print or series or prints made on the capacitive device may be the customer's graphic artwork. The graphic artwork may be a one or more of letters, numbers, words, text, instructions, information, symbols, logos, pictures, trademarks, trade names, designs, etc. that are applied to the structure by printing. The graphic artwork may be for example a company logo, a trade name, text which invites a consumer to decode the information encoded in the capacitive device and instructs the customer on how to do it (e.g., "To receive a coupon for a movie ticket, place the region below on or in close proximity to a touch screen on your mobile phone. The coupon will download to your phone").

The graphic material could be printed using virtually any type of suitable ink (e.g. water-based, solvent-based, UV curable, and/or hybrid inks) and could be applied by any suitable print method (e.g. lithography, offset, gravure, screen printing, flexography, etc.). Generally the composition of the artwork may be specific to the customer. The graphic artwork may be applied by 4-color process printing or 7-color process printing. The number of print steps may be determined by the complexity of the customer's desired graphic artwork. The SUNCARTE® FLM series of inks from Sun Chemical Corporation are suited for preparing graphic artwork.

Overprint Layers

Optionally, one or more layers of an overprint layer such as an overprint varnish (OPV) may be applied to protect the printed article (e.g. provide abrasion/scratch resistance). The overprint layers may have virtually any finish (e.g. glossy, matte, semi-matte, etc.) depending on customer requirements. The overprint layers are preferably water-based ink, but they may also be a solvent-based ink, an actinically-curable ink, a UV-curable ink, or a hybrid ink. The overprint layers maybe applied by flexography or by other print methods (e.g. lithography, screen printing, offset, and gravure). High speed printing processes such as flexography, gravure or roller coating may be used to print the overprint layers onto the device.

A suitable overprint material can be formulated from a resin solution, wax dispersion, water, and other additives. Suitable commercial products include a TERRAWET® water-based coating from Actega Coatings and Sealants, and DIGIGUARD® Gloss 100 from Michelman.

The capacitive devices described herein device exhibit good adhesion, electrical conductivity, flexibility, optical properties and resistance properties that make them well suited for use in information carriers and/or touch screen devices.

The capacitive devices described herein may be used in touch screens. Touch screens are used in devices such as smart phones, mobile phones, displays, tablet-PCs, tablet notebooks, graphic tablets, television devices, track pads, touch pads, input devices, PDAs, and/or MP3 devices. Technologies to perform this detection include resistive, capacitive, acoustic and optical technologies.

The capacitive devices described herein may be used in information carriers, such as, for example, printed products, business cards, credit cards, debit cards, stamps, signatures, postcards, tickets authorizing entry (stadiums, arenas, theatres, museums, etc.), tickets authorizing travel (trains, buses, subways, airplanes, etc.), admission cards to restricted areas (both physical areas and virtual zones), member cards, certificates (e.g., authenticating of an object and/or its origin), bill of delivery and/or sale, abstracts of accounts, instruction leaflets, vouchers (e.g. for objects in computer games and/or downloads of music, videos, e-books) and the like, but also any common products such as cups, glasses, consumer packaged goods, consumables and pre-products.

The principles embodied in the present disclosure are not limited to touch screens and/or information carriers. Other capacitive devices whose mode of detection is based on capacitive interaction may be produced as well. In particular, other touch devices such as touch pads or track pads may be used for the present invention. For example, information encoded in a capacitive device may be transferred to a laptop by placing the information carrier on the touch pad or track pad of the laptop, which identifies the pattern via capacitive interaction. Accordingly, the detection device may comprise another touch device rather than a touch screen and the method may utilize another touch device rather than a touch screen, preferably a touch pad or track pad.

Other capacitive devices whose mode of detection are based on capacitive interaction but not specifically mentioned herein are also within the scope of the present disclosure.

The following examples illustrate the capacitive devices and the methods used to make them that are described herein.

EXAMPLES

Example 1

A capacitive device was prepared by flexographic printing, by applying ink layers on and over a substrate in accordance with the following sequence.

Paperboard materials available under the trade name GOULD SILK® C2S (RockTenn) and the trade name CRESCENDO® C2s (MeadWestvaco) were used as substrates. A water-based conductive black ink available from Sun Chemical Corporation was applied to the substrates using a Comco Proglide System, 9-color flexographic press. The electrically conductive ink was printed in a serpentine pattern and cured by air drying.

Next, a UV-cured flexo non-conductive black ink, available under the trade name TPPFV9484492® from Sun Chemical Corporation, was applied using a Comco Proglide System, 9-color flexographic press and cured by exposure to UV-energy for a few seconds.

Masking layers were applied over the non-conductive ink layer and the conductive ink layer. The first masking layer applied was a UV flexo white masking layer, available under the trade name PLATINUM® 100, an acrylate-based ink including photoinitiator available from Sun Chemical Corporation. The layer was applied by flexographic printing, using a Comco Proglide System, 9-color flexographic press cured by exposure to UV-energy for a few seconds.

Two more layers of water-based flexo white masking layer, available under the trade name PMF® 10068K from Sun Chemical Corporation, were applied using a Comco Proglide System, 9-color flexographic press and cured by exposure to hot air.

Graphic artwork was applied by UV offset process printing. The graphic artwork was printed using SUNCURE® FLM series of inks available from Sun Chemical Corporation, using a KBA RAPIDA 106, 8 color sheet fed press and cured for a few seconds with exposure to UV-energy.

Then, a final layer of a water-based flexo overprint varnish (DICOAT® HG AE-1348, Rycoline, available from Sun Chemical Corporation) was applied using a KBA RAPIDA 106, 8 color sheet fed press fitted with 2 flexo print units and cured.

Performance properties for the sample capacitive devices of this example are reported in Table 1.

Example 2

A capacitive device was prepared by applying ink layers on and over a substrate in accordance with the following sequence.

The substrate was a paperboard available under the trade name FSC SUPERLUXE® from Arjowiggins. A UV offset non-conductive black ink available under the trade name FLM® 46 Process Black available from Sun Chemical Corporation that includes an epoxidized soya oil acrylate oligomer and AP resin was applied by offset printing using a KBA RAPIDA 106, 8 color sheet fed press fitted with 2 flexo print units. The layer was cured by exposure to UV energy for a few seconds.

Next, a water-based conductive black ink available from Sun Chemical Corporation was applied by flexographic printing using a KBA RAPIDA 106, 8 color sheet fed press fitted with 2 flexo print units in a selected pattern and cured in the presence of hot air. A masking layer of a water-based flexo white ink including an acrylate resin, clay and/or titania, available under the trade name PMF® 10068K from Sun Chemical Corporation was applied over the conductive ink layer using a KBA RAPIDA 106, 8 color sheet fed press fitted with 2 flexo print units.

A masking layer of a UV offset white ink, including AP resin solution, monomer, photoinitiator and titania, available under the trade name TMX84® max opaque white from Sun Chemical Corporation, was applied by offset printing using a KBA RAPIDA 106, 8 color sheet fed press fitted with 2 flexo print units and cured by exposure UV-energy for a few seconds.

Another masking layer of water-based flexo white ink (PMF® 10068K) was applied over the UV offset white ink using KBA RAPIDA 106, 8 color sheet fed press fitted with 2 flexo print units. Graphic artwork was then applied by a UV offset process printing with inks available from Toyo Ink America LLC using the KBA RAPIDA 106, 8 color sheet fed press fitted with 2 flexo print units. A final overprint layer of a water-based overprint varnish (OPV), available under the trade name ACTEGA® 110-45, available from Actega, Inc. was applied with a KBA RAPIDA 106, 8 color sheet fed press fitted with 2 flexo print units and dried with hot air.

Performance properties of the Example 2 configuration can be found in Table 1.

Example 3

A capacitive device was prepared by applying ink layers on and over a substrate in accordance with the following sequence.

The substrate is a sheet formed from a block co-polymer of styrene-butadiene-styrene (SBS). A UV offset non-conductive black ink that includes a includes acrylate oligomer and monomer as well as a photoinitiator sold under the name STARLUXE® Intense Black, available from Sun Chemical Corporation was applied by flexographic printing using a Komori 9-color sheet fed press fitted with 2 flexo print units and cured by exposure UV-energy for a few seconds.

Next, a water-based conductive black ink provided by Sun Chemical Corporation was applied by flexographic printing in a serpentine pattern using a Komori 9-color sheet fed press fitted with 2 flexo print units and cured by exposure to hot air.

A series of masking inks were then applied. First, a UV offset white ink available including AP resin solution, monomer, titania and photoinitiator available under the trade name SUNCARTE® SCC-84 Opaque Offset White from Sun Chemical Corporation was applied over the conductive ink by flexographic printing using a Komori 9-color sheet fed press fitted with 2 flexo print units and cured by exposure to UV-energy for a few seconds.

Next, a UV offset silver ink available under the trade name T+Sun_SFU11 from Sun Chemical Corporation was applied as a masking layer over the UV offset white ink by flexographic printing a using a Komori 9-color sheet fed press fitted with 2 flexo print units and cured by exposure to UV energy. Then, two layers of UV offset white ink (SUNCARTE® SCC-84 Opaque Offset White available from Sun Chemical Corporation) were applied over the UV offset silver ink by flexographic printing using a Komori 9-color sheet fed press fitted with 2 flexo print units. A water-based flexo white ink (PMF® 10068K, Sun Chemical Corporation, including acrylic resin, clay, titania and water) was then applied over the UV offset white ink layers by flexographic printing using a Komori 9-color sheet fed press fitted with 2 flexo print units and dried by exposure to hot air.

Graphic artwork was applied by UV offset process printing using HYBRYTE® Offset Process series inks (e.g., black, magenta, cyan, and yellow inks), available from Sun Chemical Corporation, using a Komori 9-color sheet fed press fitted with 2 flexo print units and cured by exposure to UV-energy.

A final overprint layer of a water-based flexo overprint varnish (DICOAT® Gloss Release Varnish, Rycoline) was applied by flexographic printing using a Komori 9-color sheet fed press fitted with 2 flexo print units and dried by exposure to hot air. The varnish may include a resin solution, water and a wax dispersion.

Performance properties for the samples of Example 3 can be found in Table 1.

Example 4

A capacitive device was prepared by printing on both sides of a substrate, as described below.

A two-sided print is prepared using solvent-based inks applied by gravure printing. The substrate used is a paperboard material available under the trade name Tembeck® CIS-10 pt from Kallima. A Bobst Lemanic 65 H gravure press with 10 stations was used to apply the ink layers.

The top side is the substrate side on which the graphics will be printed. The bottom side is the substrate side on which graphics are not printed.

A layer of silver non-conductive black ink, available under the trade name LMS® 03894 from Sun Chemical Corporation was applied to the top side of the substrate. Then a layer of non-conductive black ink (GRS05, Sun Chemical Corporation) was applied to the top side substrate and cured by exposure to hot air.

Three ink layers (LMS® 91577, LMS® 52718, LMS® 53929, available from Sun Chemical Corporation) depicting graphic artwork were applied to the top side of the substrate. A conductive black ink (GRS01 ®, available form Sun Chemical Corporation) was applied to the bottom side of the substrate. Then, a layer of non-conductive black ink (GRS05®, Sun Chemical Corporation) was applied to the bottom side over the conductive ink layer. The layers were cured by exposure to hot air.

An overprint layer of Soft Touch OPV® varnish (SCW7025, Wikoff) was applied to the top side. A layer of Overall Gloss® Varnish OPV (CAC, Coatings and Adhesive Corporation) was applied to the top side. The layers were cured by exposure to hot air.

Performance properties of the Example 4 configuration can be found in Table 1.

The present invention has been described in detail, including the preferred embodiments thereof. However, it will be appreciated that those skilled in the art, upon consideration of the present disclosure, may make modifications and/or improvements on this invention that fall within the scope and spirit of the invention.

What is claimed is:

1. A method of preparing a capacitive device, comprising:
   printing an electrically conductive ink layer and a non-electrically conductive ink layer on a substrate in a selected sequence, wherein the selected sequence comprises:
   i) printing the electrically conductive ink layer on the substrate, and printing the non-electrically conductive ink layer over the electrically conductive layer or
   ii) printing the non-electrically conductive ink layer on the substrate, and printing the electrically conductive ink layer over the non-electrically conductive ink layer; and
   printing one or more masking layers over the electrically conductive ink layer and the non-electrically conductive ink layer to cover the electrically conductive ink layer and non-electrically conductive ink layer;
   wherein, upon printing the electrically conductive ink on the substrate, the surface resistivity is <200 kilo ohm; and
   wherein the capacitive device prepared by the method generates a capacitive interaction effect that occurs when the capacitive device prepared by the method is read by another device.

2. The method of claim 1, further comprising printing graphic artwork over the one or more masking layers.

3. The method of claim 1, further comprising printing one or more layers of an overprint over the graphic artwork.

TABLE 1

Performance Properties:

| Test | Description | Example 1[1] | Example 2 | Example 3 | Example 4 |
|---|---|---|---|---|---|
| Tape Adhesion | Scratch 2 series of 6 lines 1-2 mm apart with a sharp blade Apply the tape over the scratched line and rub on the tape. After 5 seconds, remove the tape with one firm pull. Pass: ≤10% ink film removal | Pass | Pass | Pass | Pass |
| Scratch Test | Scratch the print with a fingernail perpendicular to the surface of the print. Pass: ≤10% ink film removal | Pass | Pass | Pass | Pass |
| Sutherland Rub Test | 100 rubs with 2 lb. weight Pass: Minimal marking | Pass | Pass | Pass | Pass |
| Taber Abrasion/ Scratch Test | 50 cycles Pass: Minimal marking | Pass | Pass | Pass | Pass |
| Flexibility Test | The print should be able to bend around a cylinder of diameter 25 mm without cracking | Pass | Pass | Pass | Pass |
| Optical Evaluation | Visually evaluate the optical quality and the opacity of the overprinting layers Pass: see-through of conductive layer is minimal | Pass | Pass | Pass | Pass |
| Resistivity, in kilo ohm/square, after 24 hrs. | 4 cm measurement area is measured using Elenco LCR-1810 Digital LCR Meter Pass: <200 kilo ohm/square | 8.30 | 5.83 | 6.80 | 14.44 |

[1]Prints made using both Gould Silk C2S (RockTenn) and Crescendo C2S (MeadWestvaco) substrates.

The Taber abrasion/scratch test determines the number of cycles required to reach a predetermined end point, or the appearance or condition of the specimen after a fixed number of cycles.

Table 1 demonstrates that the capacitive devices of the four (4) examples demonstrate good performance properties and fitness for use in touch screen-based applications.

4. The method of claim 1, wherein the one or more masking layers hide the electrically conductive ink layer from view.

5. The method of claim 1, further comprising applying a primer to the substrate prior to printing the electrically conductive ink layer and the non-electrically conductive ink layer on the substrate in the selected sequence.

6. The method of claim 1, wherein the electrically conductive ink layer is printed in a pattern.

7. The method of claim 1, wherein the electrically conductive ink is selected from a water-based conductive ink and a solvent-based conductive ink.

8. The method of claim 1, wherein the electrically conductive ink is selected from a water-based or solvent-based conductive flexographic ink.

9. The method of claim 1, wherein the electrically conductive ink has a color selected from black and silver.

10. The method of claim 1, wherein the non-electrically conductive ink is selected from an energy curing non-electrically conductive ink, a hybrid non-electrically conductive ink comprising an energy curing non-electrically conductive ink and an inert non-energy curing non-electrically conductive material, a water-based non-electrically conductive ink, and a solvent based non-electrically conductive ink.

11. The method of claim 1, wherein the non-electrically conductive ink has a color selected from black and silver.

12. The method of claim 1, wherein the non-electrically conductive ink is a UV-offset ink.

13. The method of claim 1, wherein the non-electrically conductive ink is printed by a method selected from flexography, offset, lithography, screen printing, and gravure.

14. The method of claim 1, wherein the one or more masking layers comprise an ink selected from a water-based ink, a solvent-based ink, a UV-curing ink, an actinically-curing ink, a hybrid ink, and combinations thereof.

15. The method of claim 1, wherein at least one of the one or more masking layers comprise a high opacity white ink.

16. The method of claim 1, wherein the one or more masking layers are printed flexographically.

17. The method of claim 2, wherein the graphic artwork is printed by a process selected from 4-color and 7-color process printing.

18. The method of claim 3, wherein the one or more layers of the overprint comprise an ink selected from a water-based ink, a solvent-based ink, and an actinically-curing ink.

19. The method of claim 3, wherein the one or more layers of the overprint are printed by high speed printing processes.

20. The method of claim 1, wherein the substrate comprises one or more materials selected from: plastics, synthetic materials, flexible material, paper, paperboard, carton, derived timber products, composite materials, ceramics, glass, cloths, textiles, leather, and combinations thereof.

21. The method of claim 20, wherein the synthetic materials are selected from polyvinyl chloride, glycol-modified polyethylene terephthalate, polycarbonate, a crystalline-biaxially oriented polyester film, polyethylene, polypropylene, and synthetic paper.

22. A capacitive device produced according to the method of claim 1.

23. The capacitive device of claim 22, wherein the capacitive device is an information carrier or a touch screen device.

24. The capacitive device of claim 22, wherein the method of preparing the capacitive device further comprises printing on a second side of the substrate.

25. The method of claim 2, wherein the graphic artwork comprises one or more of letters, numbers, words, text, instructions, information, symbols, logos, pictures, trademarks, trade names, designs, and combinations thereof.

26. The capacitive device of claim 22, wherein the capacitive device is embodied in an article selected from a touch screen, a touch pad, a playing card, an advertisement, a contest entry, a promotional item, a business card, a credit card, a debit card, a stamp, a signature, a postcard, a ticket for entry, a travel ticket, a laminate, a pass to restrict access to real and virtual locations, a member card, a ticket valid for a limited time, an authenticity certificate, a receipt, a bill of delivery, a bill of sale, an account abstract, an instruction guide, a coupon, a voucher, a cup, a glass, a bottle, a can, a carton, a bag, a label, a box, a window display, product packaging, consumables, and pre-products.

27. The capacitive device of claim 24, wherein the one or more layers printed on another substrate side, are selected from one or more non-electrically conductive ink layers, one or more masking layers, one or more graphic artwork layers, and one or more overprint layers.

* * * * *